(12) United States Patent
Ngo et al.

(10) Patent No.: US 6,980,018 B2
(45) Date of Patent: Dec. 27, 2005

(54) SELF LIMITING GATE LEAKAGE DRIVER

(75) Inventors: Hung C. Ngo, Austin, TX (US); Jente B. Kuang, Austin, TX (US); Kevin J. Nowka, Round Rock, TX (US)

(73) Assignee: Internatiional Business Machines Corporation, Armonk, NY (US)

(*) Notice: Subject to any disclaimer, the term of this patent is extended or adjusted under 35 U.S.C. 154(b) by 64 days.

(21) Appl. No.: 10/835,501

(22) Filed: Apr. 29, 2004

(65) Prior Publication Data
US 2005/0242840 A1 Nov. 3, 2005

(51) Int. Cl.[7] .......................................... H03K 19/003
(52) U.S. Cl. ................................. 326/26; 326/83
(58) Field of Search ............................ 326/26, 83

(56) References Cited

U.S. PATENT DOCUMENTS

| | | | | |
|---|---|---|---|---|
| 5,166,555 A | * | 11/1992 | Kano | 326/87 |
| 6,281,706 B1 | * | 8/2001 | Wert et al. | 326/83 |
| 6,577,178 B1 | | 6/2003 | Bernstein et al. | 327/382 |
| 6,924,669 B2 | * | 8/2005 | Itoh et al. | 326/87 |

OTHER PUBLICATIONS

Koji Nii et al. "A 90 nm Low Power 32K-Byte Embedded SRAM with Gate Leakage Suppression Circuit for Mobile Applications," 2003 Symposium on VLSI Circuits Digest of Technical Papers, pp. 247-250, no month.

* cited by examiner

*Primary Examiner*—James H. Cho
(74) *Attorney, Agent, or Firm*—Richard F. Frankeny; Winstead Sechrest & Minick P.C.; Casimer K. Salys

(57) ABSTRACT

A buffer/driver having large output devices for driving multiple loads is configured with three parallel paths. The first logic path is made of small devices and is configured to provide the logic function of the buffer without the ability to drive large loads. Second and third logic paths have the logic function of the first logic path up to the last inverting stage. The last inverting stage in each path is a single device for driving the logic states of the buffer output. The second and third logic paths have power-gating that allows the input to the pull-up and pull-down devices to float removing gate-leakage voltage stress. When the second and third logic paths are power-gated, the first logic path provides a keeper function to hold the logic state of the buffer output. The buffer may be an inverter, non-inverter, or provide a multiple input logic function.

20 Claims, 10 Drawing Sheets

SELF LIMITING GATE LEAKAGE DRIVER

GOVERNMENT RIGHTS

This invention was made with Government support under NBCH30390004 awarded by DEFENSE ADVANCED RESEARCH PROJECT AGENCY. The Government has certain rights in this invention.

CROSS-REFERENCE TO RELATED APPLICATIONS

The present invention is related to U.S. patent application Ser. No. 10/821,047, filed Apr. 8, 2004, entitled "AN INTERFACE CIRCUIT FOR COUPLING BETWEEN LOGIC CIRCUIT DOMAINS,"

U.S. patent application Ser. No. 10/821,048 filed Apr. 8, 2004, entitled "BUFFER/DRIVER CIRCUITS," and U.S. patent application Ser. No. 10/840,708, filed May 6, 2004, now U.S. Pat. No. 6,872,991, entitled "LOW GATE-LEAKAGE VIRTUAL RAIL CIRCUIT," which are incorporated by reference herein.

TECHNICAL FIELD

The present invention relates in general to complementary metal oxide semiconductor (CMOS) circuits and, in particular, to circuit methodologies for reducing leakage in sub-100 nm technologies.

BACKGROUND INFORMATION

Oxide tunneling current in metal oxide silicon (MOS) field effect transistors (FET) is a non-negligible component of power consumption as gate oxides get thinner, and may in the future become the dominant leakage mechanism in sub-100 nm complementary MOS (CMOS) circuits. The gate current is dependent on various conditions for a single transistor and three main static regions of operation may be identified for a MOSFET. The amount of gate-leakage current differs by several orders of magnitude from one region to another. Whether a transistor leaks significantly or not is also affected by its position in relation to other transistors within a CMOS circuit structure as this affects the voltage stress to which a particular device is subjected.

The three region of operation are a function of applied bias if one only considers the parameters that affect the magnitude of gate current in a MOSFET as it operates in relation to other MOSFETs. Assuming that the supply voltage (Vdd) and the threshold voltage (Vt) are fixed, then a MOSFET in a static CMOS logic gate operates in one to the three regions, each with a significantly different amount of gate leakage.

The first regions is called "strong inversion" and is the region where a MOSFET operates with the absolute value of the gate to source voltage (|VGS|) equal to Vdd. The gate-leakage current density for an N-channel FET (NFET) in strong inversion may be as high as $10^3$ amperes square centimeter ($A/cm^2$) for an oxide thickness of 0.1.5 nanometers (nm) at Vdd equal to 3 volts (V). For such a thin oxide, a more realistic value for Vdd is 1.2 V, in which case the gate-leakage current would more likely be 20 $A/cm^2$.

The second region is called the "threshold" region where |VGS|=Vt. A MOSFET operating in the threshold region will leak significantly less than one operating in the strong inversion region, typically 3 to 6 orders of magnitude less depending on Vdd and the oxide thickness.

The third region is called the "Off" region where |VGS|=0.0 V. For an NFET operating in the Off region, there is no leakage if the drain voltage (Vd)=0.0 V. However, if Vd is equal to Vdd, then a small leakage current in the reverse direction (drain to gate) may be present due to gate-drain overlap area. Of course this current depends on transistor geometry and is typically 10 orders of magnitude less than the gate-leakage current in the strong inversion region.

The above three regions represent three distinct conditions or states for the channel of a MOSFET. Whether an "ON" transistor operates at strong inversion or at threshold is determined by its position inside a logic circuit structure as well as by the state of other transistors in the circuit structure.

Both NFETs and P-channel FETs (PFETs) in a logic circuit structure operate in one of the three regions described above. However, the main tunneling current in a PFET device in strong inversion is due to hole tunneling from the valence band and the main tunneling current in an NFET device in strong inversion is due to electron tunneling from the conduction band. Because of this, PFET gate currents are about 10 times smaller than equivalent sized NFET devices. This fact is important in assessing gate-leakage in a static CMOS circuit.

Since gate leakage currents are measured as current density, it follows that the gate-leakage current in a MOSFET is directly proportional to the gate area (width times length). Transistor sizing, therefore, has a direct impact on the amount of gate-leakage in a CMOS logic circuit.

As CMOS circuits become smaller, leakage current that results when voltage is applied to the gate of the field effect transistors becomes a significant portion of the power dissipation. Leakage power may become the limiting factor in how small devices may be manufactured. As devices are made smaller, the power supply voltage is correspondingly reduced. However, this may not achieve an adequate reduction in leakage power dissipation. Alternate techniques are being employed to reduce leakage power. One popular technique is to use power-gating to isolate the power supply voltage in groups of circuits at controlled times. These circuits are sometimes referred to as being part of a power-gated domain. Other circuits may be evaluating a logic function and may not be in a power-gated domain. Interfacing between circuits in a power-gated domain and circuits in a non-power-gated domain may prove difficult. The state of an output from a power-gated domain may be uncertain during the time period of power-gating. While the benefits of power-gating are known, there is no consensus on strategies to preserve logic states of outputs in the power-gated domains. Since power-gated domains may be variable, the method of preserving output logic states from circuits in a power-gated domain are controlled by the power-gating control signals themselves.

The current drive capability of a CMOS buffer depends on the channel size of devices used to drive outputs or to drive many other logic gate inputs. Therefore, one would expect the large devices to exhibit large gate-leakage current when the technology has gate oxides that are very thin. Likewise, logic regions with a high number of logic gates may exhibit a large gate-leakage current due to the large number of devices that are in strong inversion at any one static time (between clock transitions). Logic regions with a high number of logic gates may employ power supply gating whereby the power to the logic devices are decoupled by the action MOSFETs, PFETs for the positive power supply voltage and NFETs for the negative power supply voltage.

These regions where power supply gating is employed is sometimes referred to as "cuttable" regions. When a cuttable region is interfaced with a non-cuttable region, then logic states at the interface outputs may become indeterminate when power is decoupled.

There is, therefore, a need for a circuit design for low leakage circuits that enables automatic decoupling of leakage stressed devices.

SUMMARY OF THE INVENTION

A buffer/driver topology for interfacing power-gated and non power-gated circuitry employs three parallel circuit paths. One path comprises two small area inverters in series between the buffer input and output. A first parallel path has a first input coupled to the driver input and a first output coupled to the driver output. The first parallel path comprises a first inverter with power-gating applied to the negative power supply voltage. The output of the first inverter is coupled to a PFET which is a large device used to provide current for pulling the buffer output quickly to the positive power supply voltage level. The source of the PFET is coupled to the positive power supply voltage and the drain of the PFET is coupled to the buffer output. Likewise, the second parallel path comprises a second inverter with power-gating applied to the positive power supply voltage. The output of the second inverter is coupled to an NFET which is a large device used to provide current for pulling the buffer output quickly to the negative power supply voltage level. The source of the NFET is coupled to ground and the drain of the NFET is coupled to the buffer output. When the first and second inverters are power-gated, the two small area inverters maintain the logic state of the buffer output. Since the devices in the small area inverters are small devices, they may be configured to have low leakage. The large NFET and PFET coupled to the output have their gates "floated" when the first and second inverters are power-gated, thus reducing the high leakage current of these devices. An inverting feedback is coupled from the output of the buffer back to the gates of the power gating FETs in the first and second parallel paths. Therefore, when the output goes to a logic state in response to activating one of the two output FETs, the feedback circuit automatically generates the proper logic level to the power gating device controlling the gate of the active device.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
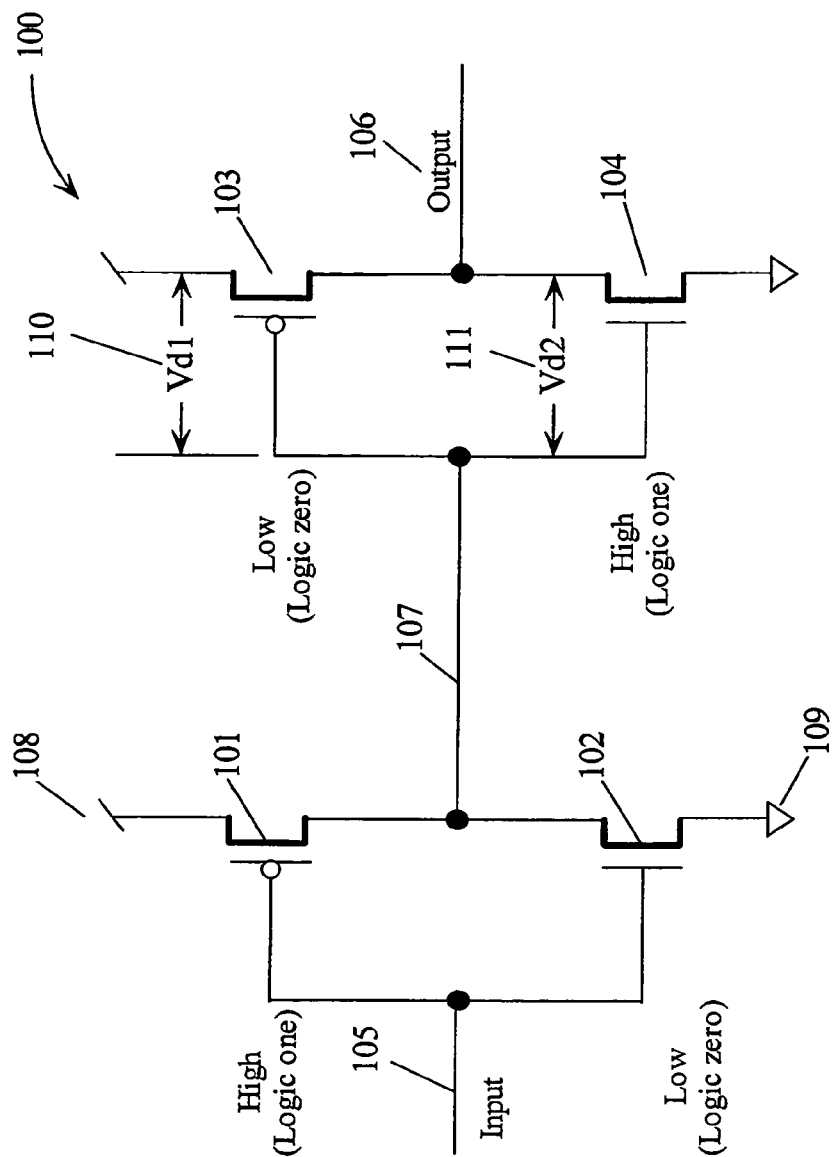
FIG. 1 is a circuit diagram of a prior art buffer illustrating the normal voltage stress that leads to leakage currents.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 is a circuit diagram of a prior art non-inverting buffer 100 comprising two inverting stages. Buffer 100 is coupled to positive power supply potential (Vdd) 108 and negative or ground power supply potential 109. When input 105 is a logic one PFET 101 is OFF and NFET 102 is ON. Intermediate node 107 is a logic zero. When node 107 is a logic zero, voltage Vd1 110 develops across the source to gate of PFET 103. PFET 103 is in the strong inversion region where it will exhibit its highest gate-leakage current. Vd1 110 is very nearly equal to the supply voltage differing only by the magnitude of the voltage across NFET 102 when it is ON. Likewise, when input 105 is a logic zero, PFET 101 is ON, charging node 107 to a logic one generating Vd2 111 across the gate to source of NFET 104. When node 107 is a logic one, NFET 102 is in the strong inversion region and will exhibit its highest gate-leakage current. Again, Vd2 111 is very nearly equal to Vdd 108. In a normal buffer design, buffer 100 would employ larger devices for PFET 103 and NFET 104 as these stages provide the output drive capabilities. While PFET 101 and NFET 102 both alternatively operate in the strong inversion region depending on the logic state of input 105, as smaller devices they will exhibit lower gate-leakage than PFET 103 and NFET 103, respectively.

Figure 2:
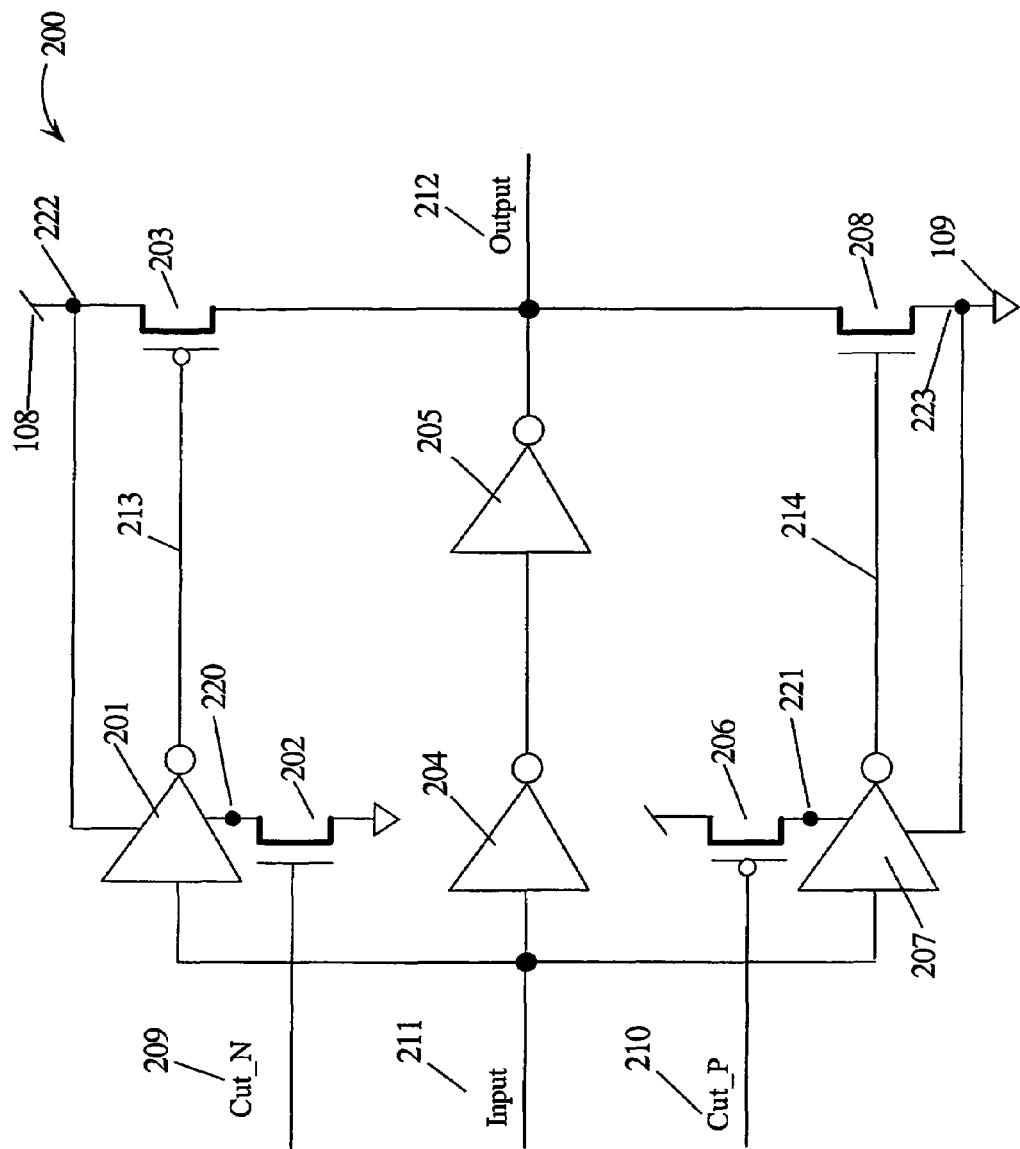
FIG. 2 is a circuit diagram of a buffer/driver with leakage stress relief devices.

FIG. 2 is a circuit diagram of a buffer 200 with leakage stress relief gating. Buffer 200 has an output stage comprising PFET 203 and NFET 208 in parallel with output inverter 205. PFET 203 is gated ON and OFF by the voltage level on node 213 driven by inverter 201. Inverter 201 has power supply node 222 coupled to the positive power supply potential and power supply gating applied to the ground potential via NFET 202 coupled to power supply node 220. NFET 202 is turned ON and OFF with control signals Cut_N 209. The input of inverter 201 is coupled to input 211. If input 211 is a logic one, then node 213 can only be driven to a logic zero if Cut_N 209 is a logic one turning ON NFET 202. IF Cut_N 209 is a logic zero and input 211 is a logic one, then node 213 "floats" reducing the voltage stress on PFET 203 that produces gate-leakage current.

NFET 208 is gated ON and OFF by the voltage level on node 214 driven by inverter 207. Inverter 207 is coupled to the ground potential of the power supply and has power supply gating applied to the positive voltage via PFET 206 coupled to power supply node 221. PFET 206 is turned ON and OFF with control signal Cut_P 210. The input of inverter 207 is coupled to input 211. If input 211 is a logic zero, then node 214 can only be driven to a logic one if Cut_P 210 is a logic zero turning ON PFET 206. IF Cut_P 210 is a logic one and input 211 is a logic zero, then node 214 "floats" reducing the stress on NFET 208.

Inverter 204 and inverter 205 provide the same function as the parallel combination of inverters 201, 207, and PFET 203 and NFET 208 when Cut_N 209 is a logic one and Cut_P 210 is a logic zero. PFET 203 and NFET 208 provide the path for high drive capability for output 212. However, if inverter 201 and inverter 207 are power-gated (via control signals Cut_N 209 and Cut_P 210), inverters 204 and 205 hold the proper logic level on output 212 as nodes 213 and 214 float, reducing the stress on PFET 203 and NFET 208.

Figure 3:
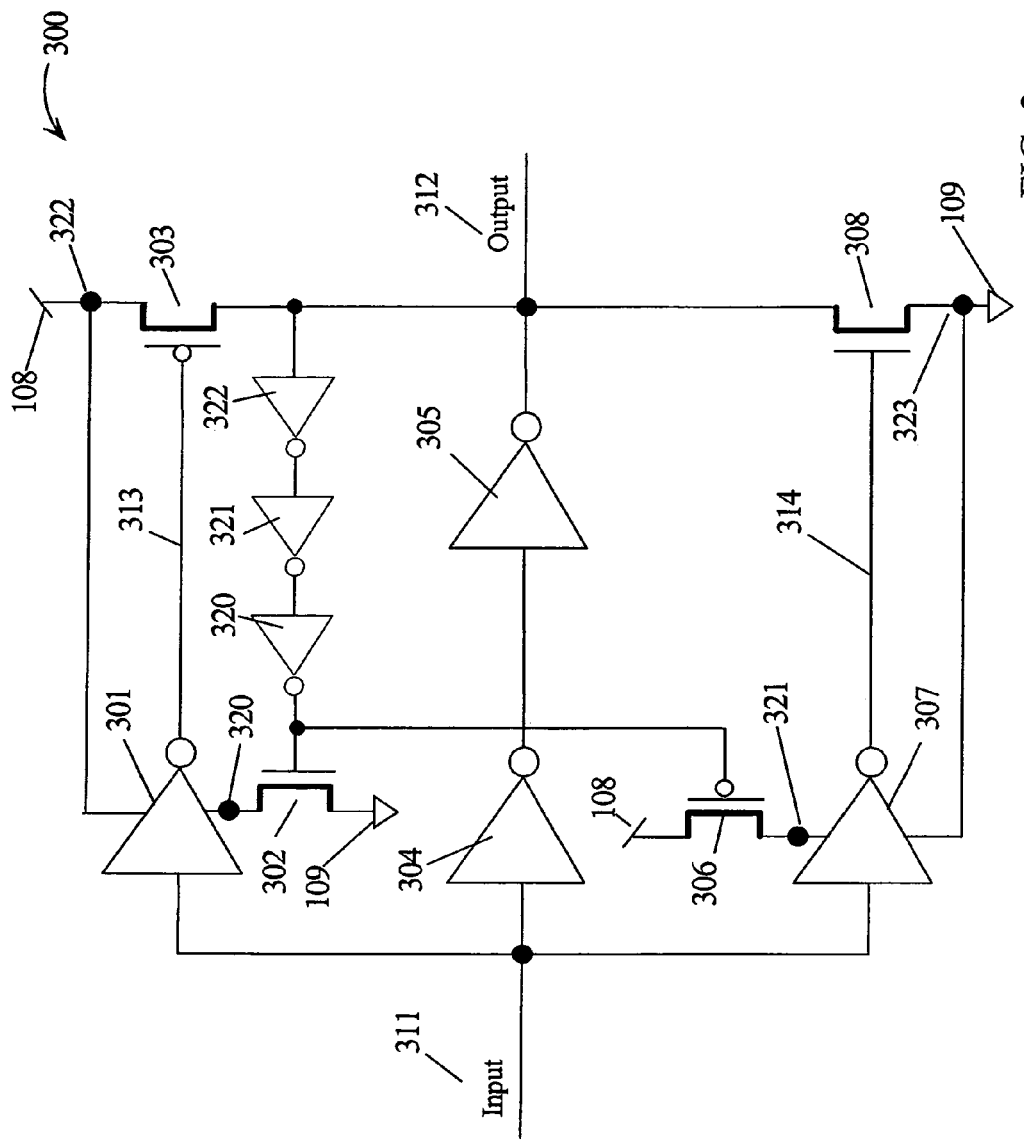
FIG. 3 is a circuit diagram of a self-limiting leakage current driver according to embodiments of the present invention.

FIG. 3 is the circuit diagram of a self-limiting leakage current driver according to embodiments of the present invention. Inverters 304 and 305 make up a low leakage logic path and receive input 311 and generate a holding output coupled to output 312 and providing a "keeper" function. Since inverters 304 and 305 are not relied on to provide the dynamic current necessary to drive loads (not shown) coupled to output 312, they both comprise small FET devices with reduced gate-leakage when operated in the strong inversion region. Power gated inverters 301 and 307 are also small as they only drive the gates of PFET 303 and NFET 308, respectively. Power gated inverter 301 is coupled to the positive voltage potential 108 of the power supply via power supply node 322. The ground voltage potential 109 of the power supply is coupled to node 320 of power gated inverter 301 with NFET 302 in response to the feedback signal on the output of inverter 320 in the feedback path. Likewise, power gated inverter 307 is coupled to the ground voltage potential 109 via power supply node 323. The positive voltage potential 108 is coupled to node 321 of power gated inverter 307 with PFET 306 in response to the feedback signal on the output of inverter 320 in the feedback path.

Inverter NFET 302 provides the conduction path to pull-down node 313 when gated ON by the feedback circuit comprising the series connection of inverters 320–322. NFET 302 is also smaller than NFET 308 since it drives only the gate of PFET 303. PFET 306 provides the conduction path to pull-up node 314 when gated ON by the feedback circuit comprising the series connection of inverters 320–322. PFET 306 is smaller than PFET 303 since it also drives only the gate of a single NFET 308.

PFET 303 enhances the logic one drive capability of output 312 when it is turned ON. If output 312 is a logic zero, then the output of inverter 320 is a logic one turning ON NFET 302. When NFET 302 is ON it provides the logic zero drive to the gate of PFET 303 allowing it to turn ON. When input 311 transitions to a logic one, node 313 transitions to a logic zero and PFET 303 turns ON driving output 312 to a logic one. Once output 312 is a logic one, the feedback path via inverters 320–322 turns OFF NFET 302 removing the logic zero drive to node 313 and allowing it to float. Inverters 304 and 305 hold the logic state of output 312 and the leakage stress on PFET 303 is automatically relieved.

NFET 308 enhances the logic zero drive capability of output 312 when it is turned ON. If output 312 is a logic one, then the output of inverter 320 is a logic zero turning ON PFET 306. When PFET 306 is ON, it provides the logic one drive to the gate of NFET 308 allowing it to turn ON. When input 311 transitions to a logic zero, node 314 transitions to a logic one and NFET 308 turns ON driving output 312 to a logic zero. Once output 312 is a logic zero, the feedback path via inverters 320–322 turns OFF PFET 306 removing the logic one drive to node 314 and allowing it to float. Inverters 304 and 305 hold the logic state of output 312 and the leakage stress on NFET 303 is automatically relieved.

Figure 4:
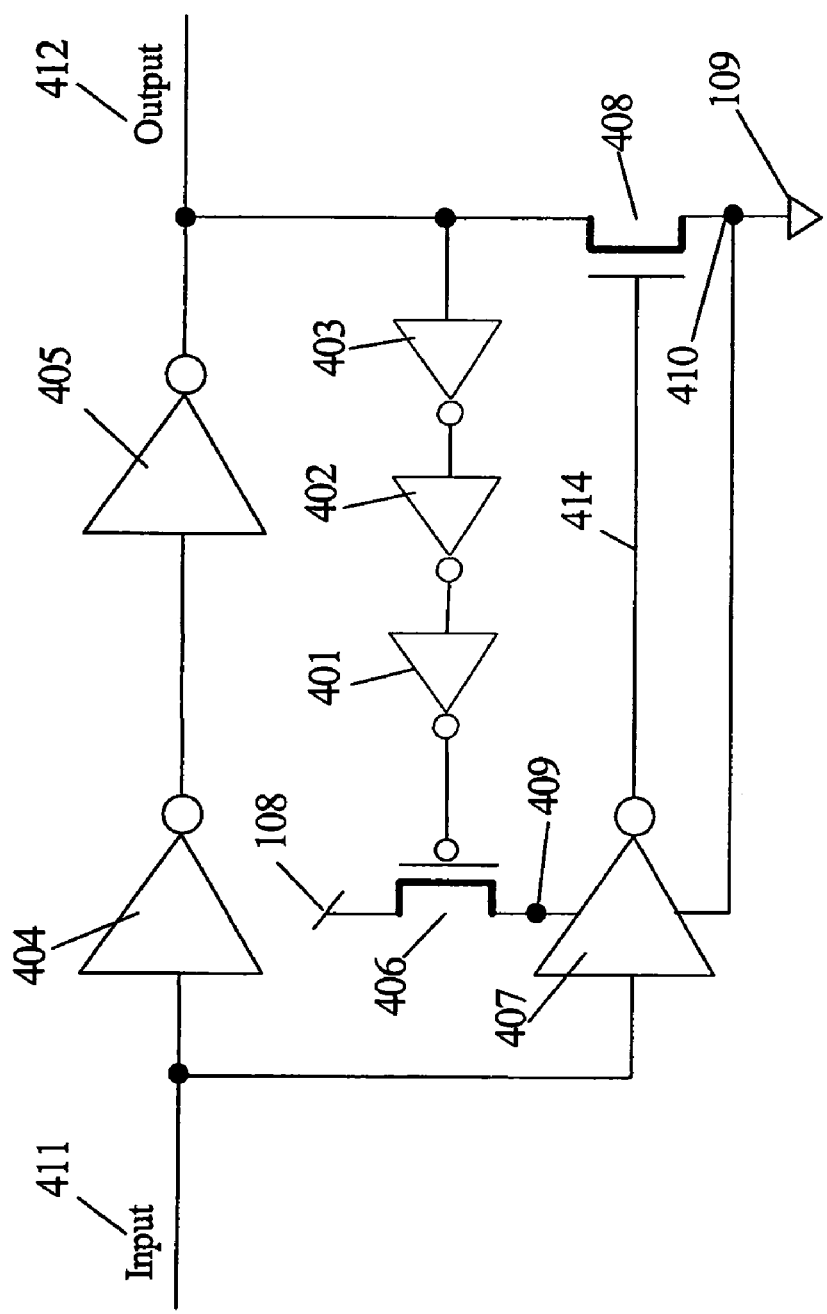
FIG. 4 is a circuit diagram of a self-limiting leakage current driver according to another embodiment of the present invention.

FIG. 4 is the circuit diagram of a self-limiting leakage current driver according to embodiments of the present invention wherein the leakage stress is relieved on only one half of the driver. In some cases, it is required to have a fast pull-down drive capability. In this case, self-limited leakage stress relief may be accomplished with fewer devices than is required for the embodiment in FIG. 3.

NFET 408 enhances the logic zero drive capability of output 412 when it is turned ON. In this embodiment, the logic one drive is provided by inverter 405 only. If output 412 is a logic one, then the output of inverter 401 is a logic zero turning ON PFET 406 When PFET 406 is ON, it provides the logic one drive to the gate of NFET 408 allowing it to turn ON. When input 411 transitions to a logic zero, node 414 transitions to a logic one and NFET 408 turns ON driving output 412 to a logic zero. Once output 412 is a logic zero, the feedback path via inverters 401–403 turns OFF PFET 406 removing the logic one drive to node 414 and allowing it to float. Low leakage inverters 404 and 405 hold the logic state of output 412 and the leakage stress on NFET 408 is automatically relieved. Power gated inverter 407 is coupled to the ground voltage potential 109 via power supply node 410. The positive voltage potential 108 is coupled to node 409 of power gated inverter 407 via PFET 406 in response to the feedback signal on the output of inverter 520 in the feedback path.

Figure 5:
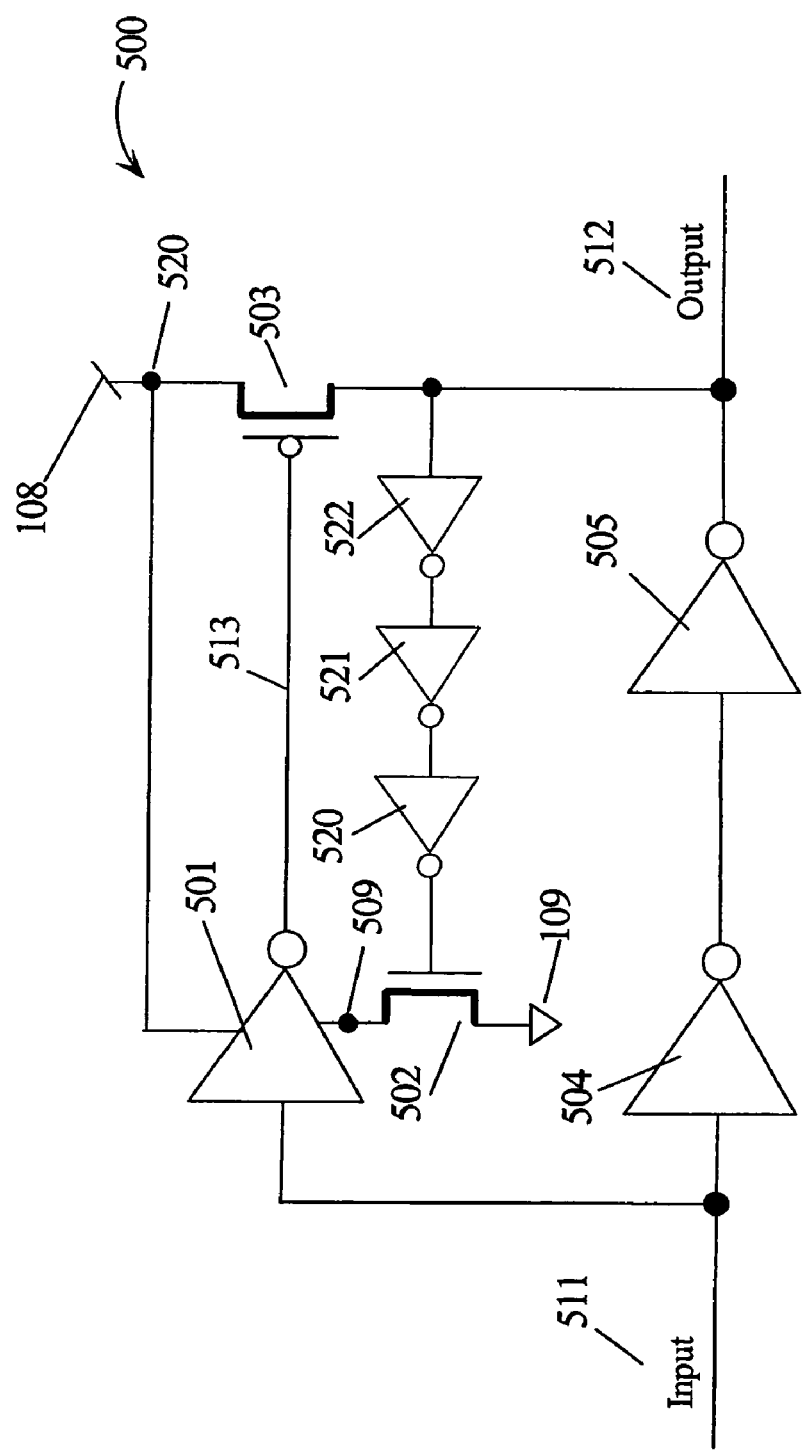
FIG. 5 is a circuit diagram of a self-limiting leakage current driver according to an embodiment of the present invention.

FIG. 5 is the circuit diagram of a self-limiting leakage current driver according to another embodiment of the present invention wherein the leakage stress is relieved on only one half of the drive. In some cases, it is required to have a fast pull-up drive capability. In this case, self-limited leakage stress relief may be accomplished with fewer devices than is required for the embodiment in FIG. 3.

PFET 503 enhances the logic one drive capability of output 512 when it is turned ON. If output 512 is a logic zero, then the output of inverter 520 is a logic one turning ON NFET 502. When NFET 502 is ON, it provides the logic zero drive to the gate of PFET 503 allowing it to turn ON. When input 511 transitions to a logic one, node 513 transitions to a logic zero and PFET 503 turns ON driving output 512 to a logic one. Once output 512 is a logic one, the feedback path via inverters 520–522 turns OFF NFET 502 removing the logic zero drive to node 513 and allowing it to float. Low leakage inverters 504 and 505 hold the logic state of output 512 and the leakage stress on PFET 503 is automatically relieved. Power gated inverter 501 is coupled to the positive voltage potential 108 via power supply node 520. The ground voltage potential 109 is coupled to node 509 of power gated inverter 501 via NFET 502 in response to the feedback signal on the output of inverter 520 in the feedback path.

Figure 6:
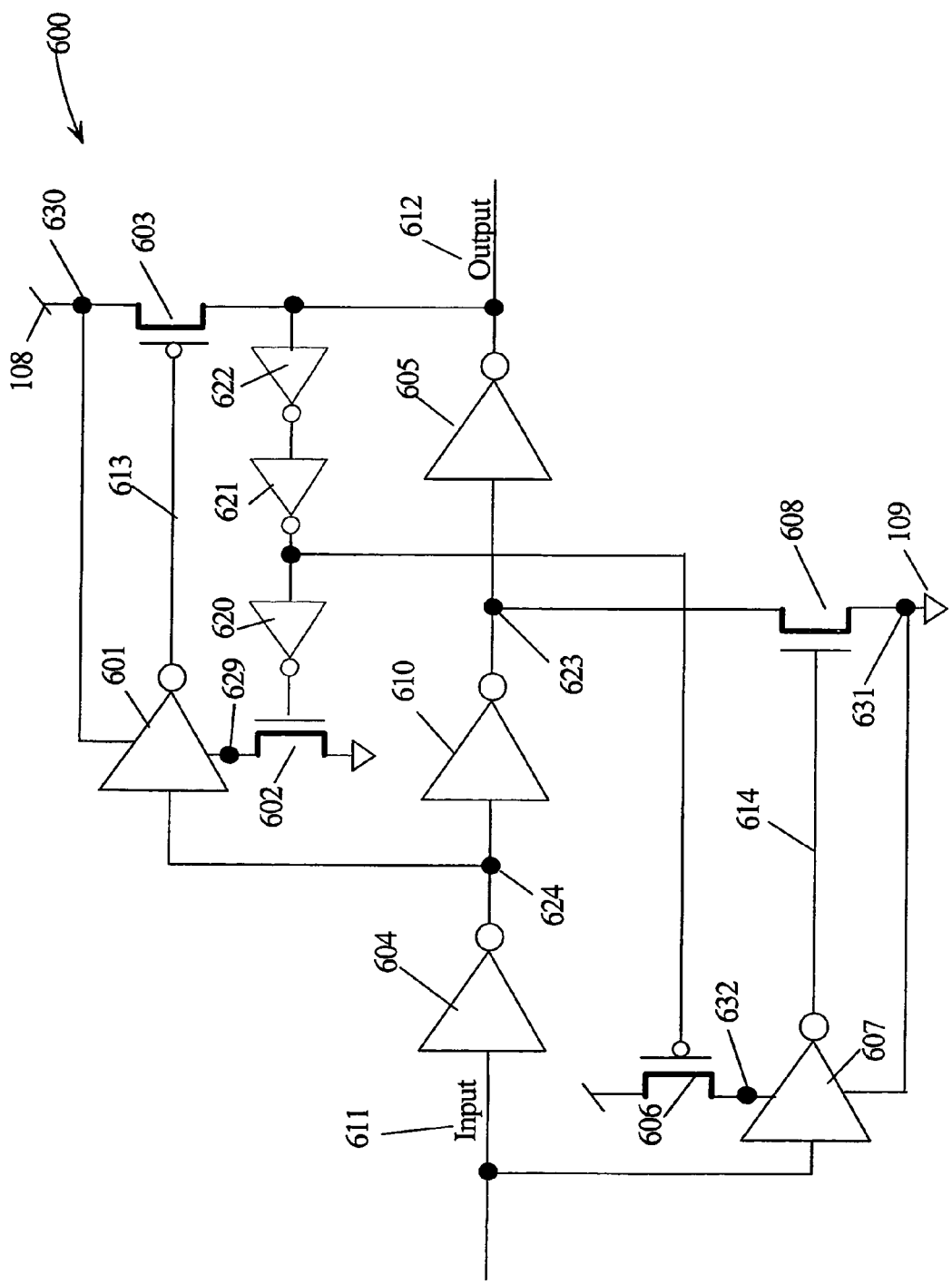
FIG. 6 is a circuit diagram of a self-limiting leakage current driver according to another embodiment of the present invention.

Sometimes it is desirable to have a driver circuit with skewed output drive capability (either the pull-up or pull-down device has more current drive capability). FIG. 6 is a circuit diagram of buffer 600 with a strong pull-up according to embodiments of the present invention. Input 611 is the input to driver 600 and couples to the input of inverter 604 and power gated inverter 607. Power gated inverter 607 is coupled to ground voltage potential 109 via power supply node 631. The positive voltage potential 108 is coupled to node 632 of power gated inverter 607 via PFET 606. Likewise, power gated inverter 601 is coupled to positive voltage potential 108 via power supply node 630. The ground voltage potential 109 is coupled to node 629 of power gated inverter 601 via NFET 602. Since NFET 608 is a large device to provide strong pull-down drive, it also has the highest gate-leakage in the strong inversion region when its gate is at a logic one. Decoupling the positive power supply from power gated inverter 607 allows node 614 to float to reduce the voltage stress on NFET 608 that causes gate-leakage current. Low leakage inverters 604, 610, and 605 act as keepers to hold the logic state of output 612 when PFET 603 is stress relieved.

PFET 603 provides enhanced logic one drive capability to output 612 when it is turned ON. When PFET 603 is making a transition to a logic one, it is desirable to have inverter 605 also make the same transition so that PFET 603 is not trying to drive output 612 to a logic one while inverter 605 is trying to hold a logic zero state. For this reason, NFET 608 is a larger device used to drive the input of inverter 605. If input 611 is a logic one then output 612 is a logic zero and both PFET 603 and NFET 608 are gated OFF and PFET 606 and NFET 602 are gated ON. When input 611 transitions to a logic zero, power gated inverter 607 transitions to a logic one quickly turning ON NFET 608 which in turn pulls the input to inverter 605 to a logic zero and output 612 starts a transition to a logic one. Since NFET 608 is a large device and inverter 610 is a small device, NFET 608 is able to override a logic one at the node 623 if necessary. Node 624 transitions to a logic one when input 611 is a logic one. Since power gated inverter 601 is enabled by the ON state of NFET 602, node 613 transitions to a logic zero turning ON PFET 603 which in turn enhances the transition of output 612 to a logic one. In this manner, output 612 is "skewed" to favor a transition from a logic zero to a logic one. Once output 612 is a logic one, feedback via series inverters 620–622 turns NFET 602 and PFET 606 OFF automatically relieving the leakage stress on the large devices, PFET 603 and NFET 608.

Figure 7:
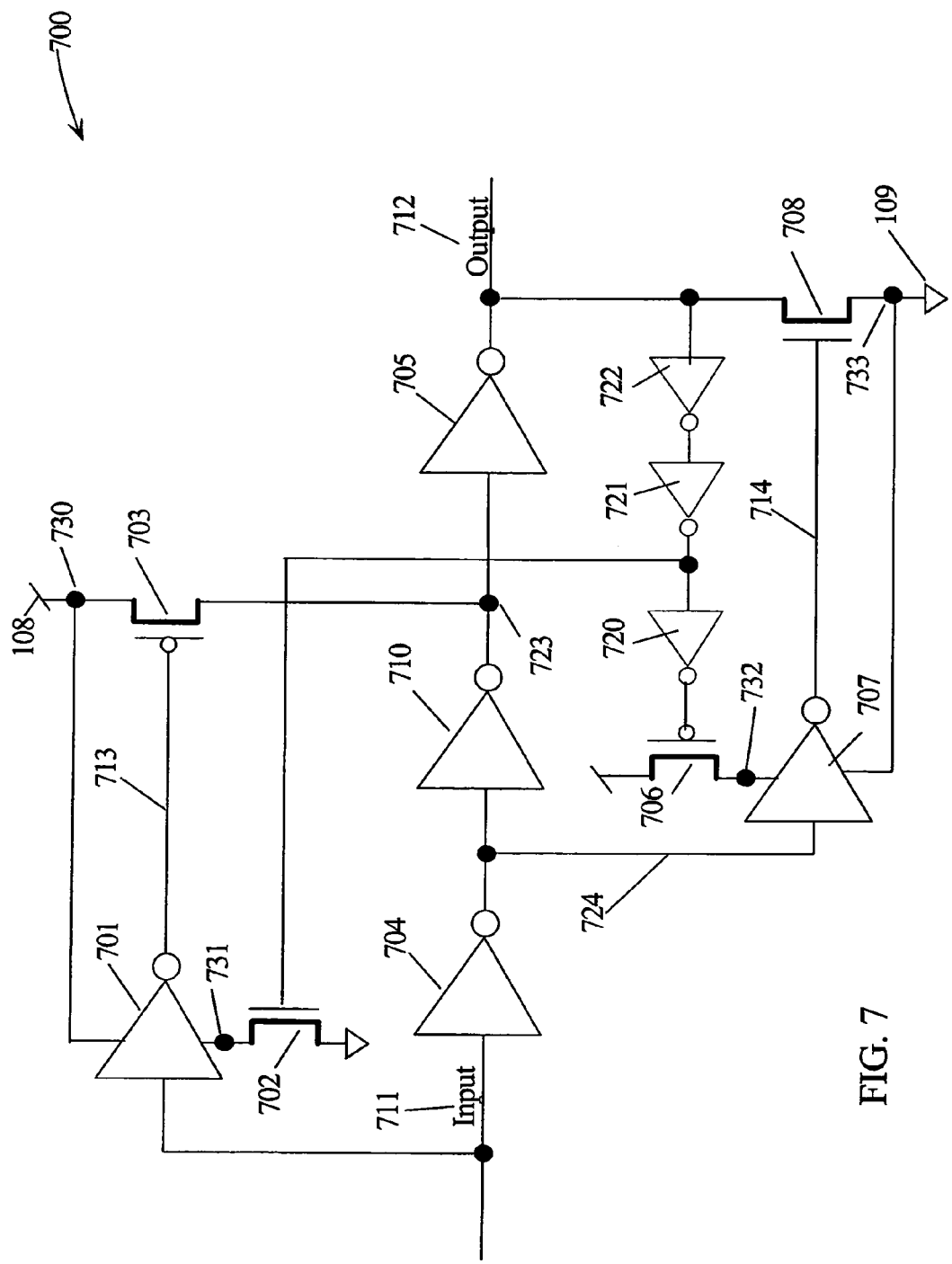
FIG. 7 is a circuit diagram of a self-limiting leakage current driver according to another embodiment of the present invention.

FIG. 7 is a circuit diagram of buffer 700 with a strong pull-down according to embodiments of the present invention. Input 711 is the input to driver 700 and couples to the input of inverter 704 and power gated inverter 701. Power gated inverter 701 is coupled to positive voltage potential 108 via power supply node 730. The ground voltage potential 109 is coupled to node 731 of power gated inverter 701 via NFET 702 in response to the second feedback signal on the output of inverter 721 in the feedback path. Likewise, power gated inverter 707 is coupled to ground voltage potential 109 via power supply node 733. The positive voltage potential 108 is coupled to node 732 of power gated inverter 707 via PFET 706 in response to the first feedback signal on the output of inverter 720 in the feedback path.

In FIG. 7, NFET 708 provides enhanced logic zero drive capability on output 712 when it is turned ON. When NFET 708 is making a transition to a logic zero, it is desirable to have inverter 705 also make the same transition so that NFET 708 is not trying to drive output 712 to a logic zero while inverter 705 is trying to hold a logic one state. For this reason, PFET 703 is a larger device used to drive the input of inverter 705. If input 711 is a logic one, then output 712 is a logic zero and both PFET 706 and NFET 702 are gated OFF and PFET 703 and NFET 708 are gated ON. When input 711 transitions to a logic one, power gated inverter 701 transitions to a logic zero quickly turning ON PFET 703 which in turn pulls the input to inverter 705 to a logic one and output 712 starts a transition to a logic zero. Since PFET 703 is a large device and inverter 710 is a small device it is able to override a logic zero at the node 723, if necessary. Since power gated inverter 707 is enabled by the ON state of PFET 706, node 714 transitions to a logic zero turning ON NFET 708 which in turn enhances the transition of output 712 to a logic zero. In this manner, output 712 is "skewed" to favor a transition from a logic one to a logic zero. Once output 712 is a logic zero, feedback via series inverters 720–722 turns NFET 702 and PFET 706 OFF automatically relieving the leakage stress on the large devices, PFET 703 and NFET 708.

Figure 8:
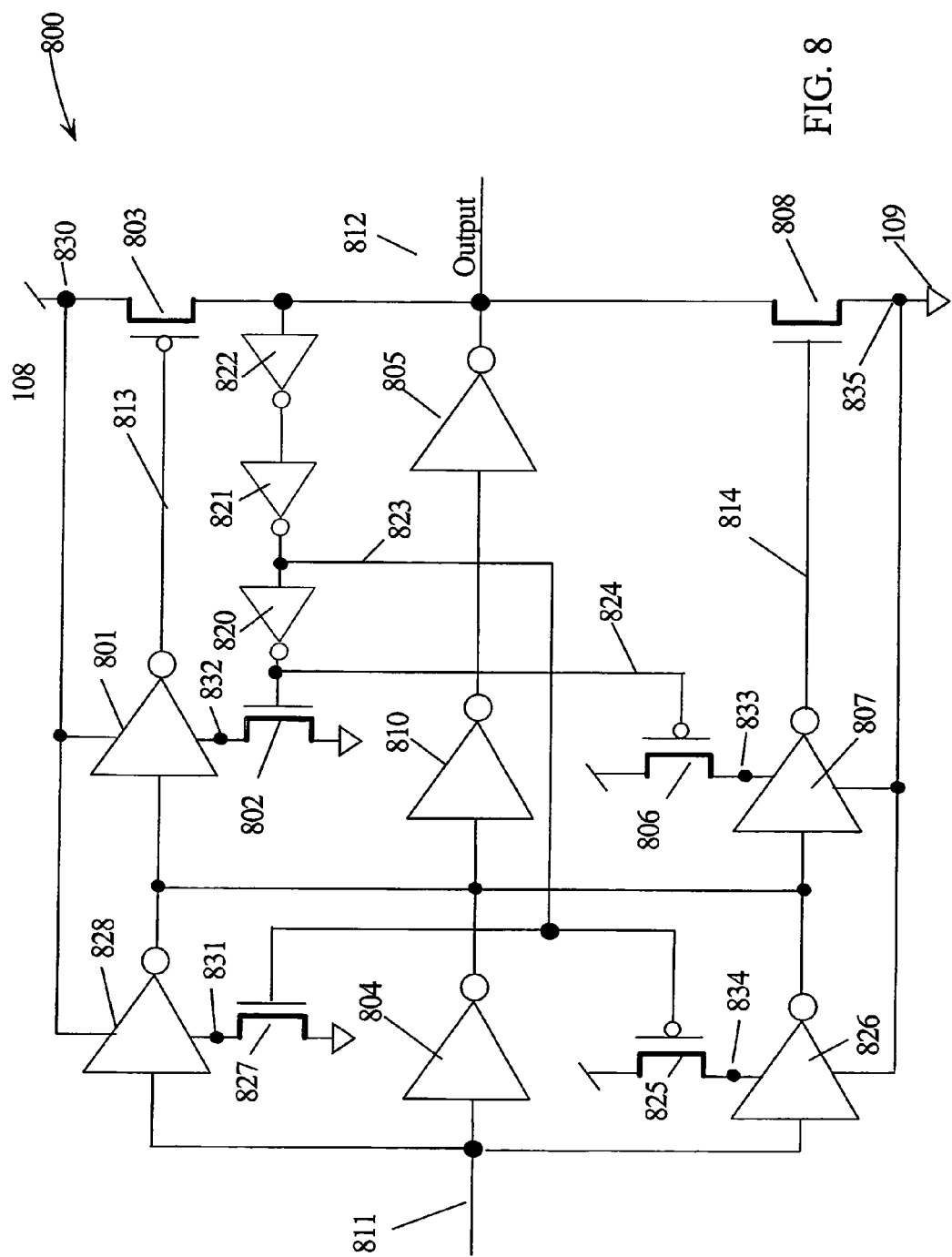
FIG. 8 is a circuit diagram of a self-limiting leakage current driver according to another embodiment of the present invention.

FIG. 3 illustrated a non-inverting buffer circuit with self-limited leakage current according to embodiments of the present invention. FIG. 8 is a circuit diagram of an inverting buffer circuit with self-limited leakage current according to another embodiment of the present invention. Low leakage inverters 804, 810 and 805 provide the primary small device logic path and output 812 provides the logic inversion of input 811. The are two high leakage logic paths in parallel with the low leakage path of inverters 804, 810 and 805. Power gated inverters 828, 801 and PFET 803 comprise the high leakage path for providing enhanced logic one drive to output 812 and power gated inverters 826, 807 and NFET 808 comprise the high leakage path for providing enhanced logic zero drive to output 812.

Power gated inverters 801 and 828 are coupled to the positive voltage potential 108 of the power supply via node 830. The ground voltage potential of the power supply is coupled to node 831 of power gated inverter 828 via NFET 827 in response to the second feedback signal on the output of inverter 821 in the feedback path. Likewise, the ground voltage potential of the power supply is coupled to node 832 of power gated inverter 801 via NFET 802 in response to the first feedback signal on the output of inverter 820 in the feedback path.

Power gate inverters 807 and 826 are coupled to the ground voltage potential 109 of the power supply via node 835. The positive voltage potential of the power supply is coupled to node 834 of power gated inverter 826 via PFET 825 in response to the second feedback signal on the output of inverter 821 in the feedback path. Likewise, the positive voltage potential of the power supply is coupled to node 833 of power gated inverter 807 via PFET 806 in response to the first feedback signal on the output of inverter 820 in the feedback path.

PFET 803 enhances the logic one output drive of output 812 and NFET 808 enhances the logic zero output drive of output 812. Power gated inverter 801 provides the logic zero output drive for PFET 803. When NFET 802 is gated OFF, node 813 floats and the leakage current stress on FET 803 is relieved. Likewise, power gated inverter 807 provides the logic one drive for the gate of NFET 808. When PFET 806 is gated OFF, node 814 floats and the leakage current stress on NFET 808 is relieved. Feedback via the series connection of inverters 820–822 automatically turn OFF corresponding PFET 806 and NFET 802 when output 812 attains an enhanced logic one or enhanced logic zero automatically self-limiting the leakage of PFET 803 and NFET 808. If inverter 828 and 826 are large devices, they may be optionally automatically stress relieved via NFET 827 and PFET 825 via second feedback output 823 from inverter 821. Second feedback output 823 is the logic inversion of first feedback output 824.

Figure 9:
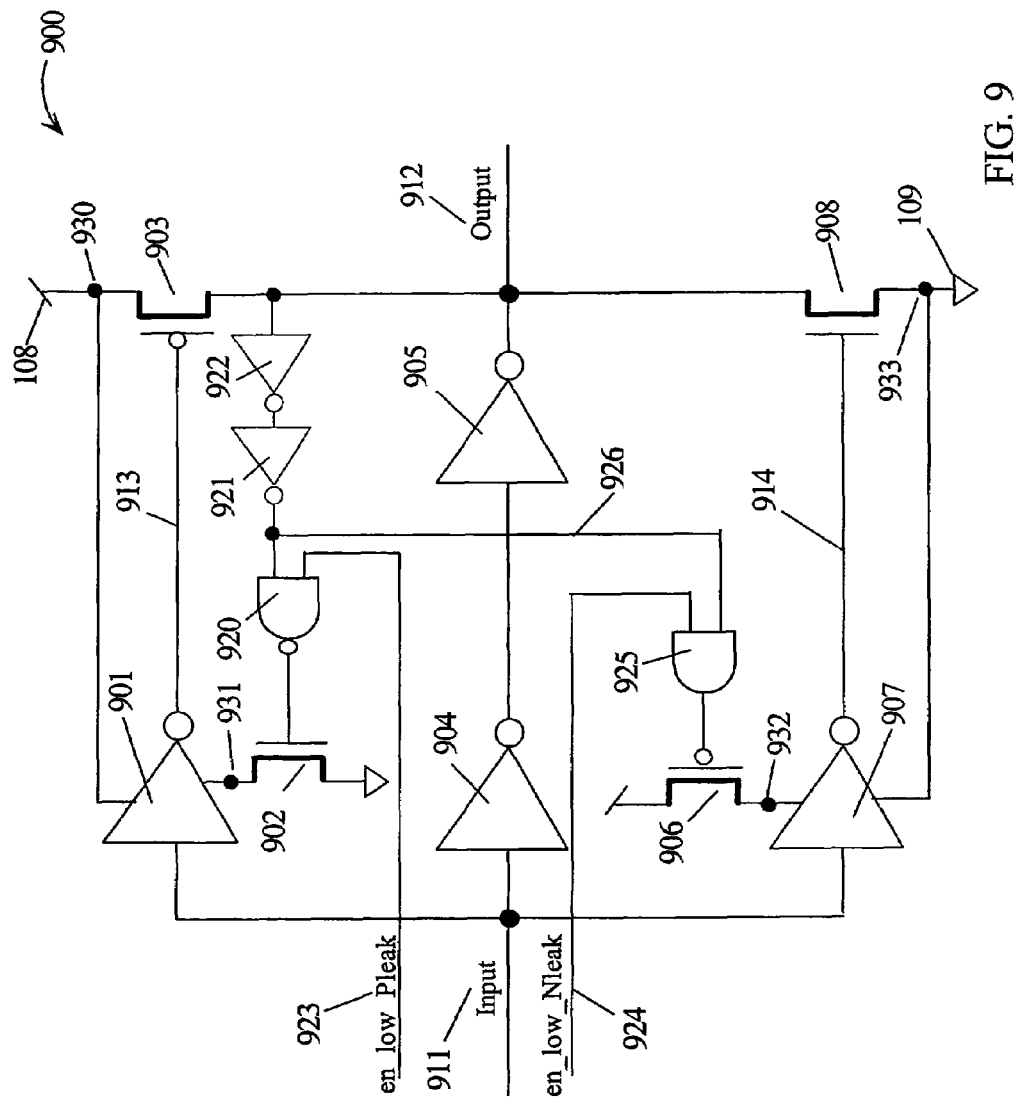
FIG. 9 is a circuit diagram of a self-limiting leakage current driver according to another embodiment of the present invention.

FIG. 9 is another embodiment of the present invention where the feedback path providing automatic limiting of leakage current is gated with control signals en_low_Pleak 923 and en_low_Nleak 924. NAND gates 920 and 925 are the third inverting stage in the feedback path and are active when their corresponding control signals are a logic one. Otherwise, the outputs of NAND gates 920 and 925 providing the first feedback signal are gated OFF. This allows the evaluation of the leakage control for the NFET 908 and PFET 903 devices separately or in combination. The low leakage path comprises inverters 904 and 905 and provide a holding function on output 912 when the high leakage paths are power gated. Power gated inverter 901 and PFET 903 provide a high leakage path for enhancing the logic one output drive of output 912. Power gated inverter 901 is coupled to the positive voltage potential of the power supply via power supply node 930. The ground voltage potential of the power supply is coupled to node 931 of power gated inverter via NFET 902 in response to the gated first feedback signal on the output of NAND 920.

Power gated inverter 907 and NFET 908 provide a high leakage path for enhancing the logic zero output drive of output 912. Power gated inverter 907 is coupled to the ground voltage potential 109 of the power supply via power supply node 933. The positive voltage potential 108 of the power supply is coupled to node 932 of power gated inverter via PFET 906 in response to the gated first feedback signal on the output of NAND 925.

Figure 10:
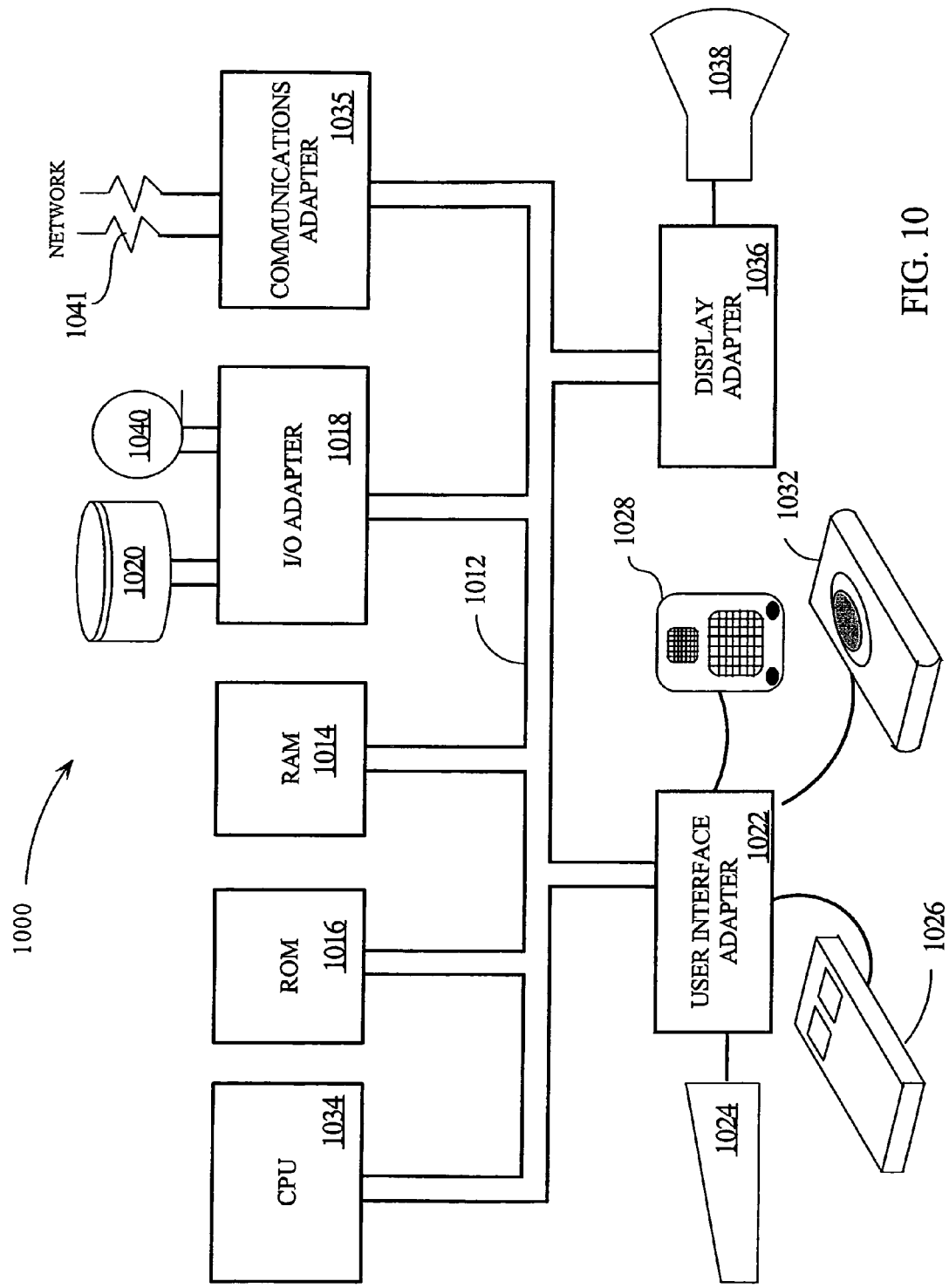
FIG. 10 is a block diagram of a data processing system suitable for practicing embodiments of the present invention.

FIG. 10 is a high level functional block diagram of a representative data processing system 1000 suitable for practicing the principles of the present invention. Data processing system 1000 includes a central processing system (CPU) 1010 operating in conjunction with a system bus 1012. System bus 1012 operates in accordance with a standard bus protocol, such as the ISA protocol, compatible with CPU 1010. CPU 1010 operates in conjunction with electronically erasable programmable read-only memory (EEPROM) 1016 and random access memory (RAM) 1014. Among other things, EEPROM 1016 supports storage of the Basic Input Output System (BIOS) data and recovery code. RAM 1014 includes, DRAM (Dynamic Random Access Memory) system memory and SRAM (Static Random Access Memory) external cache. I/O Adapter 1018 allows for an interconnection between the devices on system bus 1012 and external peripherals, such as mass storage devices (e.g., a hard drive, floppy drive or CD/ROM drive), or a printer 1040. A peripheral device 1020 is, for example, coupled to a peripheral control interface (PCI) bus, and I/O adapter 1018 therefore may be a PCI bus bridge. User interface adapter 1022 couples various user input devices, such as a keyboard 1024 or mouse 1026 to the processing devices on bus 1012. Display 1038 which may be, for example, a cathode ray tube (CRT), liquid crystal display (LCD) or similar conventional display units. Display adapter 1036 may include, among other things, a conventional display controller and frame buffer memory. Data processing system 1000 may be selectively coupled to a computer or telecommunications network 1041 through communications adapter 1034. Communications adapter 1034 may include, for example, a modem for connection to a telecom network and/or hardware and software for connecting to a computer network such as a local area network (LAN) or a wide area network (WAN). CPU 1010 and other components of data processing system 1000 may contain low leakage logic circuitry according to embodiments of the present invention for controlling gate-leakage currents.

What is claimed is:

1. A reduced leakage logic circuit having a first logic input and a logic output comprising:
    a low leakage logic path receiving the first logic input and generating a holding output coupled to the logic output;
    a feedback circuit having a feedback input coupled to the logic output and a first feedback output generating a first feedback signal in response to logic states of the logic output;
    a first high leakage logic path receiving the first logic input and generating a first drive output coupled to the logic output, the first drive output enhancing a current drive capability of a first logic state of the logic output in response to a first logic state of the logic input and a first logic state of the first feedback signal; and
    first power gating circuitry for coupling a first voltage potential of a power supply to the first high leakage logic path in response to the first logic state of the first feedback signal thereby enabling the first drive output and decoupling the first voltage potential from the first high leakage logic path in response to a second logic state of the first feedback signal thereby disabling the first drive output.

2. The reduced leakage logic circuit of claim 1 further comprising:
    a second high leakage logic path receiving the first logic input and generating a second drive output coupled to the logic output, the second drive output enhancing a current drive capability of a second logic state of the logic output in response to a second logic state of the logic input and the second logic state of the first feedback signal; and
    second power gating circuitry for coupling a second voltage potential of the power supply to the second high leakage logic path in response to the second logic state of the first feedback signal thereby enabling the second drive output and decoupling the second voltage potential from the second high leakage logic path in response to a first logic state of the first feedback signal thereby disabling the second drive output.

3. The reduced leakage logic circuit of claim 1, wherein the first high leakage logic path comprises:
    a first inverting power-gated logic circuit having a first power supply node coupled to a second voltage potential of the power supply, a second power supply node, an input receiving the first logic input, an a first intermediate logic output generating the second logic state in response to the first logic state of the logic input and the first logic state of the first feedback signal, wherein the first intermediate logic output floats in response to the second logic state of the first feedback signal;
    a first power inverting stage having an input coupled to the first intermediate logic output and an output generating the first drive output; and
    a first electronic switch having a first node coupled to the first voltage potential, a second node coupled to the second power supply node, and a control input coupled to the first feedback signal, wherein the first electronic switch couples the first voltage potential to the second power supply node in response to the second logic state of the first feedback signal.

4. The reduced leakage logic circuit of claim 2, wherein the second high leakage logic path comprises:
- a second inverting power-gated logic circuit having a first power supply node coupled to the first voltage potential of the power supply, a second power supply node, an input receiving the first logic input, and a second intermediate logic output generating the first logic state in response to the second logic state of the logic input and the second logic state of the first feedback signal, wherein the second intermediate logic output floats in response to the first logic state of the first feedback signal;
- a second power inverting stage having an input coupled to the second intermediate logic output and an output generating the second drive output; and
- a second electronic switch having a first node coupled to the second voltage potential, a second node coupled to the second power supply node, and a control input coupled to the first feedback signal, wherein the second electronic switch couples the second voltage potential to the second power supply node in response to the first logic state of the first feedback signal.

5. The reduced leakage logic circuit of claim 4, wherein the first power inverting stage comprises a large NFET having a gate coupled to the first intermediate logic output, a source coupled to the second voltage potential and a drain forming the first drive output of the first power inverting stage.

6. The reduced leakage logic circuit of claim 5, wherein the second power inverting stage comprises a large PFET having a gate coupled to the second intermediate logic output, a source coupled to the first voltage potential and a drain forming the second drive output of the second power inverting stage.

7. The reduced leakage logic circuit 6, wherein the first electronic switch comprises a PFET having a source coupled to the first node of the first electronic switch, a gate coupled to the control input of the first electronic switch and a drain coupled to the second node of the first electronic switch, wherein the PFET couples the first voltage potential to the first power-gated logic circuit in response to the first logic state of the first feedback signal.

8. The reduced leakage logic circuit of claim 7, wherein the second electronic switch comprises an NFET having a source coupled to the first node of the second electronic switch, a gate coupled to the control input of the second electronic switch, and a drain coupled to the second node of the second electronic switch, wherein the NFET couples the second voltage potential to the second power-gated logic circuit in response to the second logic state of the first feedback signal.

9. The reduced leakage logic circuit of claim 1, wherein the first feedback circuit further comprises a second feedback output generating a second feedback signal as the complement of the first feedback signal.

10. The reduced leakage logic circuit of claim 9, wherein the low leakage logic path comprises:
- a first inverting stage having an input receiving the first logic input and generating a first intermediate output; and
- a second inverting stage receiving the first intermediate output and generating the an output coupled to the logic output.

11. The reduced leakage logic circuit of claim 10 further comprising:
- an inverting stage receiving a second logic input and generating the first logic input;
- a second high leakage logic path receiving the second logic input and generating a second drive output coupled to the first intermediate logic output, the second drive output enhancing a current drive capability of the second logic state of the first intermediate logic output in response to a second logic state of the second logic input and a second logic state of the second feedback signal; and
- second power gating circuitry for coupling a second voltage potential of the power supply to the second high leakage logic path in response to the second logic state of the second feedback signal thereby enabling the second drive output and decoupling the second voltage potential from the second high leakage logic path in response to a first logic state of the second feedback signal thereby disabling the second drive output.

12. The reduced leakage logic circuit of claim 11, wherein the second high leakage logic path comprises:
- a second inverting power-gated logic circuit having a first power supply node coupled to the first voltage potential of the power supply, a second power supply node, an input receiving the second logic input, and a second intermediate logic output generating the first logic state in response to the second logic state of the second logic input and the second logic state of the second feedback signal, wherein the second intermediate logic output floats in response to the first logic state of the second feedback signal;
- a second power inverting stage having an input coupled to the second intermediate logic output and an output coupled to the first intermediate logic output; and
- a second electronic switch having a first node coupled to the second voltage potential, a second node coupled to the second power supply node, and a control input coupled to the second feedback signal, wherein the third electronic switch couples the second voltage potential to the second power supply node in response to the second logic state of the second feedback signal.

13. The reduced leakage logic circuit of claim 9 further comprising:
- a second high leakage logic path receiving the first logic input and generating a second drive output coupled to the logic output, the second drive output enhancing a current drive, capability of a second logic state of the logic output in response to a second logic state of the logic input and the second logic state of the second feedback signal, wherein a second voltage potential of the power supply is coupled to the second high leakage logic path in response to the second logic state of the second feedback signal thereby enabling the second drive output and decoupled from the second high leakage logic path in response to a first logic state of the second feedback signal thereby disabling the second drive output;
- an inverting stage receiving a second logic input and generating the first logic input;
- a third high leakage logic path receiving the second logic input and generating a first power gated output coupled to the first logic input, wherein the first power gated output generates the second logic state in response to the first logic state of the second logic input and the first logic state of the second feedback signal and floats in response to the second logic state of the second feedback signal; and third power gating circuitry for coupling the first voltage potential of the power supply to the third high leakage logic path in response to the first logic state of the second feedback signal and decoupling the first voltage potential from the third high leakage logic path in response to the second logic state of the second feedback signal.

14. The reduced leakage logic circuit of claim 13 further comprising:
a fourth high leakage logic path receiving the second logic input and generating a second power gated output coupled to the first logic input, wherein the second power gated output generates the first logic state in response to the second logic state of the second logic input and the second logic state of the second feedback signal and floats in response to the first logic state of the second feedback signal; and
fourth power gating circuitry for coupling the second voltage potential of the power supply to the fourth high leakage logic path in response to the second logic state of the second feedback signal and decoupling the second voltage potential from the fourth high leakage logic path in response to the first logic state of the second feedback signal.

15. The reduced leakage logic circuit of claim 1, wherein the first feedback output is gated with a first low leakage enable signal having a first logic state enabling the first feedback signal and a second logic state disabling the first feedback signal.

16. The reduced leakage logic circuit of claim 15, wherein the feedback circuit further comprises a second feedback output generating a second feedback signal gated with a second low leakage enable signal having a first logic state enabling the second feedback signal and a second logic state disabling the second feedback signal.

17. The reduced leakage logic circuit of claim 16 further comprising:
a second high leakage logic path receiving the first logic input and generating a second drive output coupled to the logic output, the second drive output enhancing a current drive capability of a second logic state of the logic output in response to a second logic state of the logic input and the second logic state of the second feedback signal, wherein a second voltage potential of the power supply is coupled to the second high leakage logic path in response to the second logic state of the second feedback signal thereby enabling the second drive output and decoupled from the second high leakage logic path in response to a first logic state of the second feedback signal thereby disabling the second drive output.

18. A data processing system comprising a central processing unit (CPU) including a reduced leakage logic circuit a low leakage logic path receiving a first logic input and generating a holding output coupled to a logic output, a feedback circuit having a feedback input coupled to the logic output and a first feedback output generating a first feedback signal in response to logic states of the logic output, a first high leakage logic path receiving the first logic input and generating a first drive output coupled to the logic output, the first drive output enhancing a current drive capability of a first logic state of the logic output in response to a first logic state of the logic input and a first logic state of the first feedback signal, and first power gating circuitry for coupling a first voltage potential of a power supply to the first high leakage logic path in response to the first logic state of the first feedback signal thereby enabling the first drive output and decoupling the first voltage potential from the first high leakage logic path in response to a second logic state of the first feedback signal thereby disabling the first drive output.

19. The data processing system of claim 18 further comprising:
a second high leakage logic path receiving the first logic input and generating a second drive output coupled to the logic output, the second drive output enhancing a current drive capability of a second logic state of the logic output in response to a second logic state of the logic input and the second logic state of the first feedback signal; and
second power gating circuitry for coupling a second voltage potential of the power supply to the second high leakage logic path in response to the second logic state of the first feedback signal thereby enabling the second drive output and decoupling the second voltage potential from the second high leakage logic path in response to a first logic state of the first feedback signal thereby disabling the second drive output.

20. The data processing system of claim 19, wherein the first high leakage logic path comprises:
a first inverting power-gated logic circuit having a first power supply node coupled to a second voltage potential of the power supply, a second power supply node, an input receiving the first logic input, an a first intermediate logic output generating the second logic state in response to the first logic state of the logic input and the first logic state of the first feedback signal, wherein the first intermediate logic output floats in response to the second logic state of the first feedback signal;
a first power inverting stage having an input coupled to the first intermediate logic output and an output generating the first drive output; and
a first electronic switch having a first node coupled to the first voltage potential, a second node coupled to the second power supply node, and a control input coupled to the first feedback signal, wherein the first electronic switch couples the first voltage potential to the second power supply node in response to the second logic state of the first feedback signal.

* * * * *